United States Patent [19]
Eguchi et al.

[11] Patent Number: 6,087,825
[45] Date of Patent: Jul. 11, 2000

[54] WAVEFORM SAMPLING APPARATUS

[75] Inventors: Hiroshi Eguchi; Kazuo Sakamoto; Eiichi Yada, all of Tokyo, Japan

[73] Assignee: Advantest Corporation, Tokyo, Japan

[21] Appl. No.: 08/923,388

[22] Filed: Sep. 3, 1997

[30] Foreign Application Priority Data

Sep. 3, 1996 [JP] Japan ..................................... 8-233050

[51] Int. Cl.[7] .............................................. G01R 13/20
[52] U.S. Cl. ...................................................... 324/121 R
[58] Field of Search ......................... 324/121 R; 702/66, 702/70, 72, 73

[56] References Cited

U.S. PATENT DOCUMENTS

| | | | |
|---|---|---|---|
| 4,641,246 | 2/1987 | Halbert et al. | 341/163 |
| 4,807,147 | 2/1989 | Halbert et al. | 702/66 |

Primary Examiner—Josie Ballato
Assistant Examiner—Russell M. Kobert
Attorney, Agent, or Firm—Knobbe, Martens, Olson & Bear, LLP

[57] ABSTRACT

Disclosed is a waveform measuring apparatus in which an integration period T can be discretionally set to a value in accordance with the analog voltage cycle of the device being measured with a simple circuit configuration. The waveform measuring apparatus has an integrator circuit for integrating a fixed repeat-cycle analog input voltage during a period when a gate is ON and the waveform measuring apparatus converts the analog input voltage based on the integrated output of the integrator circuit. By use of a control portion consisting of a gate controller and a phase shifter, the first cycle of a period covering 2 cycles of the analog input voltage is deemed to be a first integration period and the second cycle thereof is deemed to be a second integration period; during the first integration period the gate ON/OFF is controlled using a control signal which alternates repeatedly between ON/OFF at each unit cycle corresponding to a unit integration time and during the second integration period the gate ON/OFF is controlled with a signal which is the inversion of the control signal.

5 Claims, 6 Drawing Sheets

6,087,825

WAVEFORM SAMPLING APPARATUS

BACKGROUND OF THE INVENTION

1. Field of the Invention

The present invention relates to a WAVEFORM MEASURING APPARATUS AND A WAVEFORM OBTAINING METHOD for A/D converting a fixed repeat-cycle analog input voltage.

2. Description of the Prior Art

FIG. 1 shows an example of a conventional waveform measuring system comprising a integrator circuit and an A/D converter.

In FIG. 1, the waveform measuring system consists of an integrator circuit 101, a digitizing circuit 102 and a gate controller 103 which are connected to a CPU 104 via a CPU bus. A memory 105 and a display device 106 and such like are also connected via the CPU bus to the CPU 104.

The integrator circuit 101 is a well known integrator circuit in which an analog voltage is integrated by controlling the ON/OFF state of a integrator gate. In the integrator circuit 101, integrator gate ON/OFF control; integration is performed while the integrator gate is ON and the integral is outputted while the gate is OFF. The digitizing circuit 102 digitizes the integral outputted from the integrator circuit 101. The gate controller 103 controls the ON/OFF state of the integrator gate in the integrator circuit 101 by outputting a gate control signal to the integrator circuit 101.

The CPU 104 uses software processing to data-process the value digitized by the digitizing circuit 102, displays the processed result on the display screen 106 and stores it in the memory 105. The type of data processing performed here is for example processing to determine the average value of multiple waveform measurements of an analog input voltage.

In the above-mentioned waveform measuring system, for an analog input signal with a repeat-cycle T' as shown in FIG. 2, integration is carried out during integration time T1 during which the integrator gate is ON; the integral is output and the integrator is reset during reset time T2 in which the integrator gate is OFF.

The waveform measuring system described above has the following disadvantages.

It is desirable to be able to set the integration period T, which consists of integration time T1 and reset time T2, to a value (e.g. 500 ms, 1.0 s, 10 s or such like) in accordance with the cycle of the analog output voltage of the device being measured. In a conventional waveform measuring system the circuit configuration of the gate controller and integrator circuit required in order to vary the integrator period T to a discretionary value has been complex.

In addition, problems such as leaks in the integrator circuit and overflow in the digitizing circuit have occurred when the integrator time T1 has been set to a long time, and these elements are unfortunately included in the data outputted after A/D conversion.

SUMMARY OF THE INVENTION

The object of the present invention is to provide a waveform measuring apparatus and a waveform obtaining method that solve the problems described above, and which can discretionally set the integration period T to a value in accordance with the cycle of the analog output voltage of the device being measured without increasing the complexity, and moreover without problems such as leakage and overflow.

In order to achieve the above objective, a first waveform measuring apparatus of the present invention is a waveform measuring apparatus comprising:

an integrator circuit having a gate for switching, which integrates a fixed repeat-cycle analog input voltage during a period when the gate is ON;

control means for controlling the ON/OFF of the gate based on a unit integration time set discretionally; and an A/D converter for A/D converting the analog input voltage based on the integrated output of the integrator circuit;

wherein said control means take the first cycle of a period covering 2 cycles of the analog input voltage to be a first integration period, takes the second cycle thereof to be a second integration period, control the gate ON/OFF with a control signal which alternates repeatedly between ON/OFF at each unit cycle corresponding to the unit integration time during the first integration period and control the gate ON/OFF with the control signal inverted in phase during the second integration period.

A second waveform measuring apparatus of the present invention is a waveform measuring apparatus comprising:

first and second integrator circuits each having a gate for switching, which integrate a fixed repeat-cycle analog input voltage during a period when the gate is ON;

a gate controller for outputting a gate control signal which alternates repeatedly ON/OFF at each unit cycle which corresponds to a unit integration time set discretionally;

a phase inverter for inverting the phase of a gate control signal inputted to the second integrator circuit; and a A/D converter for A/D converting the analog input voltage based on the integrated output of the integrator circuits.

A first waveform obtaining method of the present invention is a waveform obtaining method which integrates a fixed repeat-cycle analog input voltage, comprising the steps of:

taking the first cycle of a period covering 2 cycles of the analog input voltage to be a first integration period and taking the second cycle thereof to be a second integration period; and integrating the analog input voltage with first gate control signal which alternates repeatedly between ON/OFF at each unit cycle corresponding to a unit integration time set discretionally during the first integration period and integrating the analog input voltage with second gate control signal inverted the phase of the first gate control signal, thereby obtaining the integral of the analog input voltage.

A second waveform obtaining method of the present invention is a waveform obtaining method which integrates a fixed repeat-cycle analog input voltage, comprising the steps of:

integrating the analog input voltage with a gate control signal which is repeated ON/OFF at each unit cycle corresponding to a unit integration time set discretionally and integrating the analog input voltage with the gate control signal which has been inverted, thereby obtaining an integral of the analog input voltage.

According to the present invention described above, since an integrator circuit integrates an analog input voltage based on a gate control signal which is repeated ON/OFF at each unit cycle which corresponds to a unit integration time set beforehand, when the unit integration time is shortened, integration time can be set to a value in accordance with the analog input voltage cycle. Furthermore, since an analog input voltage is integrated at each unit integration time, even if the integration time is set to a long time, there is no integrator circuit leakage, digitizing circuit overflow or other such problems as a conventional system.

According to an aspect of the present invention, the first cycle of a period containing 2 cycles of an analog input voltage is deemed to be a first integration period and the second cycle thereof is deemed to be a second integration period; during the first integration period the gate ON/OFF is controlled with a control signal which alternates repeatedly between ON/OFF at each unit cycle which corresponds to unit integration time and during the second integration period the gate ON/OFF is controlled with the phase inverted control signal; therefore the portion not integrated in the first integration period is integrated in the second integration period with the result that the analog input voltage is integrated at each unit integration time over 1 cycle.

According to another aspect of the present invention in which an analog input voltage is A/D converted based on the output of first and second integrator circuits, the first integrator circuit is controlled based on a gate control signal which is repeated ON/OFF at each unit cycle which corresponds to unit integration time set beforehand, and the second integrator circuit is controlled by means of the phase inverted control signal; therefore a portion not integrated in the first integrator circuit is integrated in the second integrator circuit with the result as above that the analog input voltage is integrated at each unit integration time over 1 cycle.

According to the present invention as described above, an integrator-type A/D converter in which the integration period can be discretionally set to a value in accordance with the cycle of an analog input voltage can be realized with a simple configuration.

Furthermore, since an analog input voltage is integrated at each unit integration time, there are no problems such as integrator circuit leakage or digitizing circuit overflow even if the integration time is set to a long time.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENTS

The preferred embodiments of the present invention will next be explained with reference to the diagrams.

Figure 3:
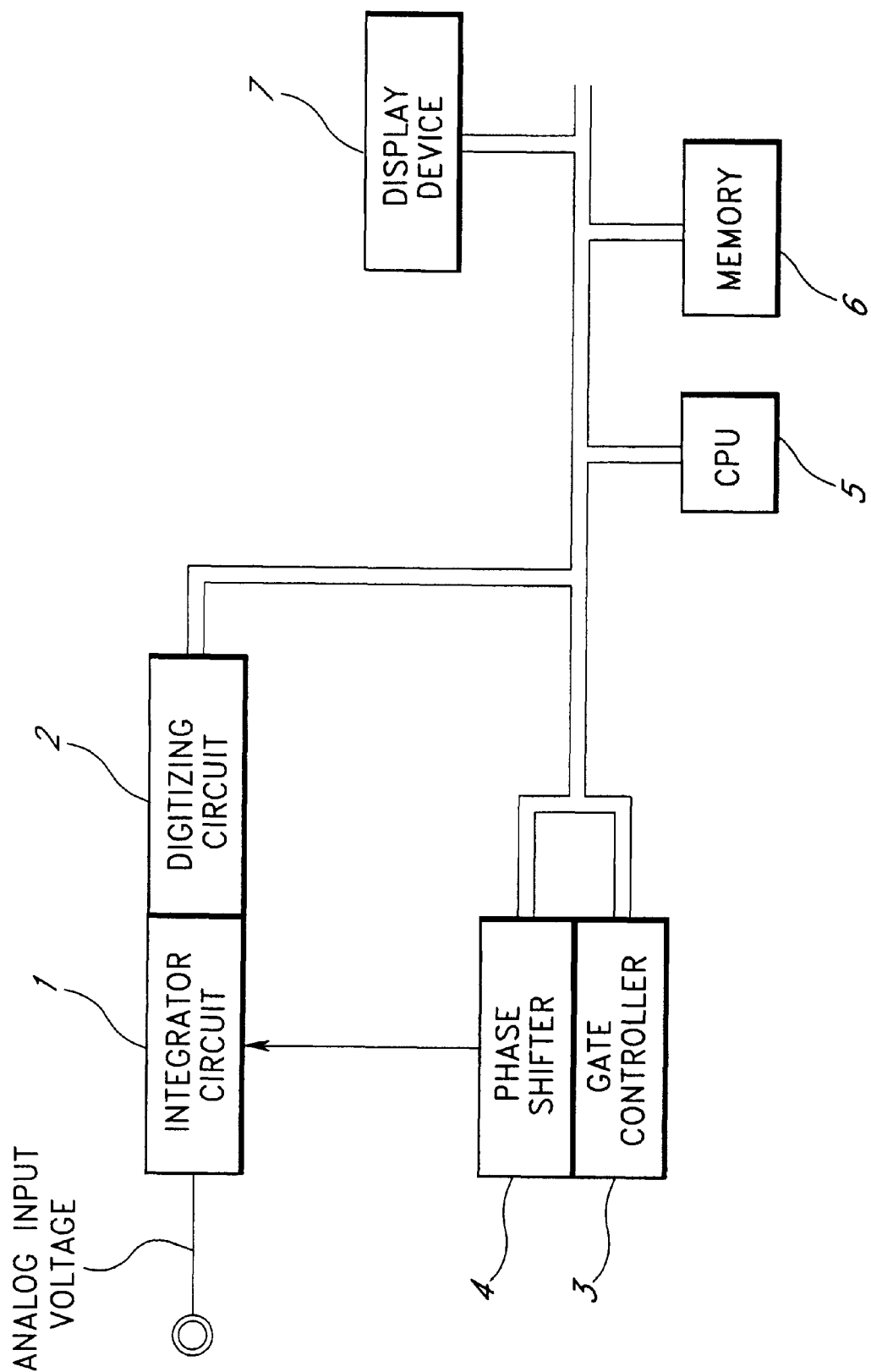
FIG. 3 is a circuit configuration diagram showing a first embodiment of the present invention.

FIG. 3 is a circuit configuration diagram showing a first embodiment of a waveform measuring system of the present invention.

In FIG. 3, a waveform measuring system consisting of an integrator circuit 1, a digitizing circuit 2, a gate controller 3 and a phase shifter 4 is connected to a CPU 5 via a CPU bus. A memory 6 and a display device 7 and such like are connected to the CPU 5 via the CPU bus.

Figure 1:
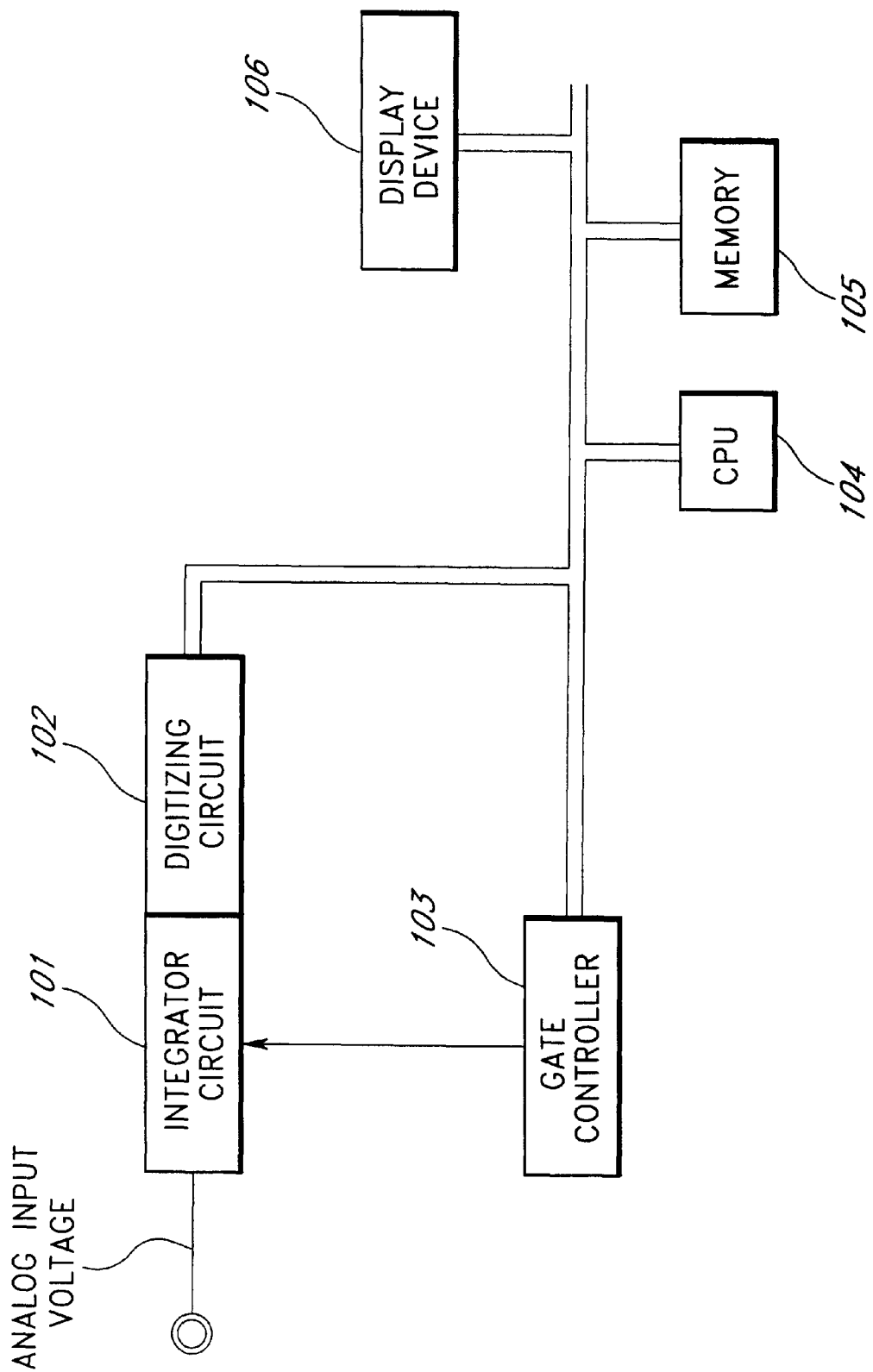
FIG. 1 is a block diagram depicting an example of a conventional waveform measuring system.
Figure 2:
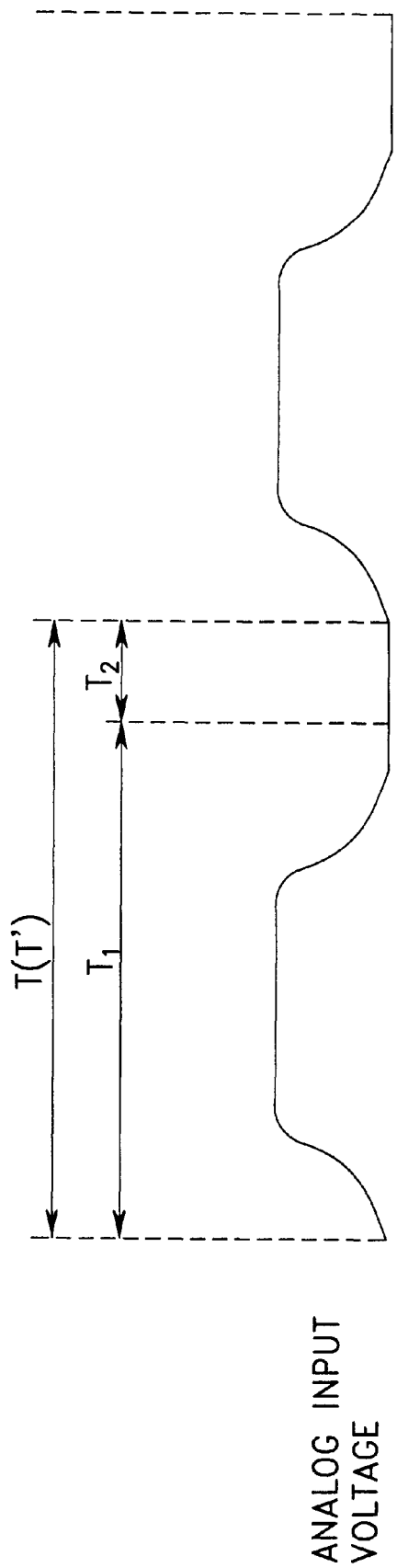
FIG. 2 is a diagram showing the integration operation of the waveform measuring system depicted in FIG. 1.

The integrator circuit 1 is a well known integrator circuit in which an analog input voltage is integrated by means of controlling the ON/OFF state of the integrator gate. In the integrator circuit 1, integration is performed while the integrator gate is ON and the integral is outputted while the gate is OFF. The integrator circuit 1 is reset upon outputting the integral. The integrator circuit 1 is reset upon outputting the integral. The digitizing circuit 2 digitizes the integral outputted from the integrator circuit 1. The gate controller 3 controls the ON/OFF state of the integrator gate in the integrator circuit 1 by outputting a gate control signal to the integrator circuit 1. The phase shifter 4 shifts the phase of a control signal outputted from the gate controller 3 by a predetermined period of time. The CPU 5, the memory 6 and the display device are identical to those elements depicted in FIG. 1 and so explanation of these elements will be omitted here.

Utilizing the fact that an analog input voltage has a fixed repeat-cycle, the waveform measuring system performs integration using a first cycle of the analog input voltage and a second cycle which follows the first cycle and performs A/D conversion based on the resulting outputted integral.

Figure 4:
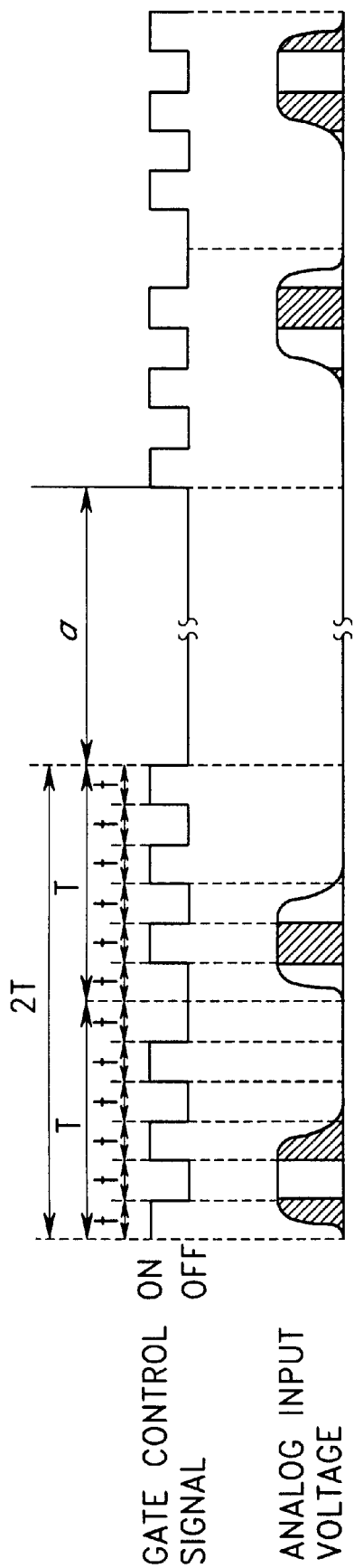
FIG. 4 is a diagram showing the integration operation of the waveform measuring system depicted in FIG. 3.

FIG. 4 shows the integration operation for this waveform measuring system. In the diagram, T indicates an integration period set to a value in accordance with the cycle of the analog output voltage of the device being measured and thus T corresponds to a cycle of the analog input voltage. Integration is carried out over 2 T periods. t is a pre-set unit integration time in the present system. The gate controller 3 controls the ON/OFF state of the integrator gate based on the unit integration time t.

During the first integration period T (the first cycle of the analog input voltage), the integrator gate is controlled in compliance with a gate control signal which alternates ON/OFF at each unit integration time t, integration being carried out at each unit at which the gate control signal is ON (portions shaded with diagonal lines) and the integrator circuit 1 outputs the integral at each unit integration time t. During the second integration period T (the second cycle of the analog input voltage), the integrator gate is controlled with a signal formed by delaying the phase of the gate control signal by unit integration time t using the phase shifter 4 and the portion (shaded with diagonal lines) which was not integrated in the first cycle T is integrated.

Here, integration period T can be set to a value corresponding to the cycle of the analog input voltage; in the case of the present embodiment, T is set to a value which fulfills the condition: T=2nt (n=1, 2, 3, . . .). Since the minimum resolution to which integration period T can be set is 2t, by shortening t it is possible in practice to set integration period T to almost any given time length. Furthermore, since the analog input voltage is integrated at each unit integration time t, no problems such as leakage from the integrator circuit or overflow from the digitizing circuit 2 arise even if the integration period T is set to a long time length.

Each value integrated by the integrator circuit 1 at each unit integration time t is outputted to the digitizing circuit 2; the digitizing circuit 2 digitizes the integrals and sends them through the CPU bus as measurement data.

In a waveform measuring system, if V (m) denotes a value integrated by the integrator circuit 1 at the mth unit integration time t and subsequently digitized by the digitizing circuit 2, waveform measurement data value V is obtained by the following equation:

$$V = \frac{1}{2n} \sum_{m=1}^{2n} V(m)$$

When measurement has been carried out using a period of 2T as described above, the next measurement, namely A/D conversion using a period of 2T commences after time α has elapsed. Time α can be altered according to the circumstances of the system irrespective of the cycle of the analog input voltage.

Embodiment 2

Figure 5:
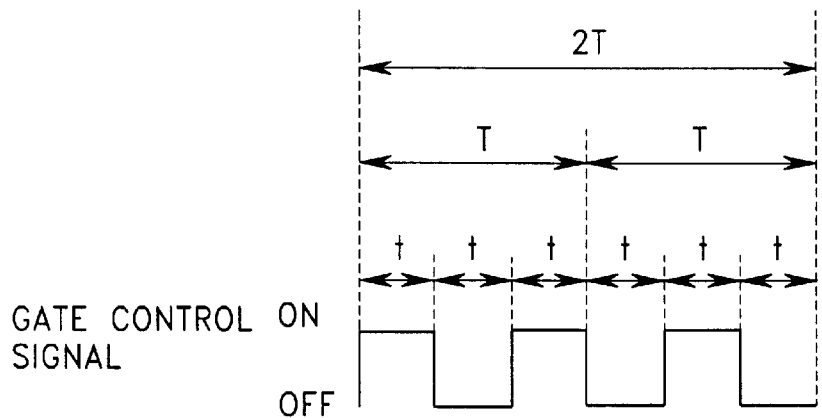
FIG. 5 is a diagram showing a gate control signal in a second embodiment of the present invention.

In the waveform measuring system of the first embodiment, the integration period T was set to fulfill the condition: T=2nt (n=1, 2, 3, . . .) but with the condition: T=(2n−1) t (n=1, 2, 3, . . .), the gate control signal in the second cycle T becomes an inversion of the gate control in the first cycle T as shown in FIG. 5 and consequently there is no need to provide a phase shifter 4.

In such a case, if V (m) denotes a value integrated by the integrator circuit 1 at the mth unit integration time t and then digitized by the digitizing circuit 2, a waveform measurement data value V is obtained by the following equation:

$$V = \frac{1}{2n-1} \sum_{m=1}^{2n-1} V(m)$$

In an integrator-type A/D converter of the present embodiment, integration period T can be set to a value in accordance with the cycle of the analog output voltage of the device being measured as in the first embodiment described above. Furthermore, problems such as leakage from the integrator circuit or overflow from the digitizing circuit 2 do not arise even if the integration period T is set to a long time length.

Embodiment 3

Figure 6:
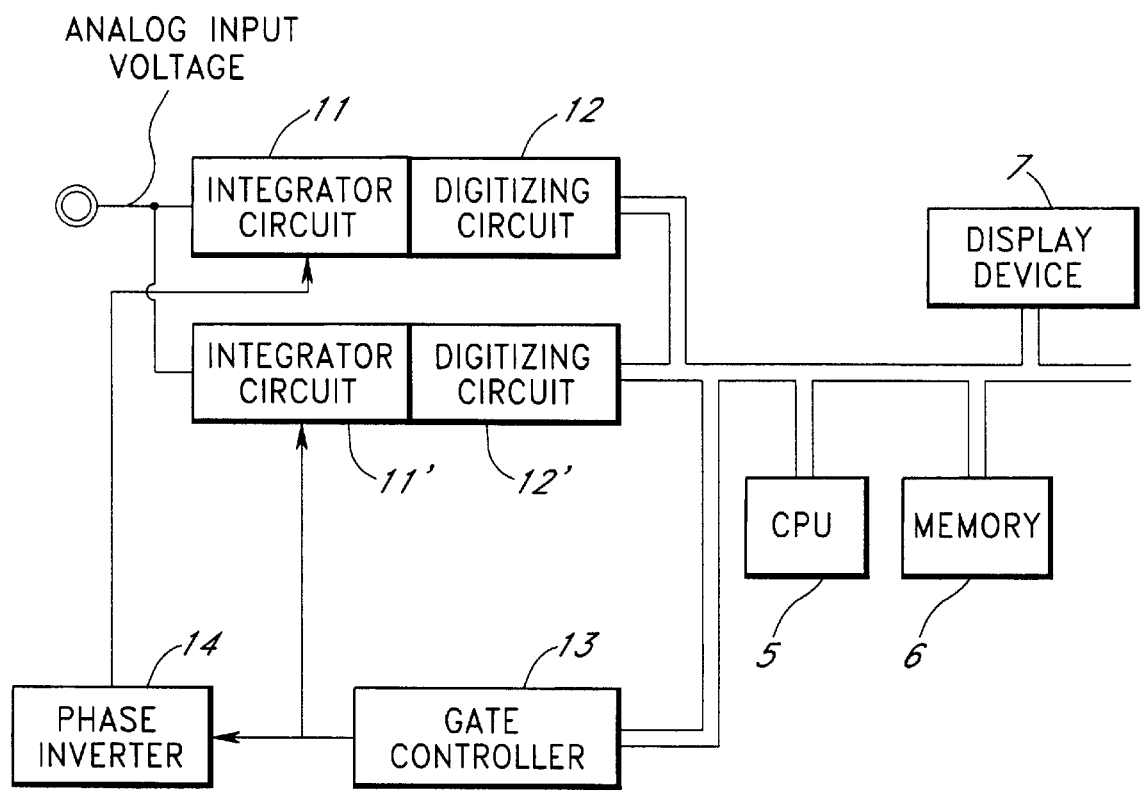
FIG. 6 is a circuit configuration diagram showing a third embodiment of the present invention.

FIG. 6 is a circuit configuration diagram showing a waveform measuring system comprising an integrator-type A/D converter according to a third embodiment of the present invention.

In FIG. 6, the waveform measuring system comprises integrator circuits 11 and 11' to which an analog input voltage is inputted respectively. digitizing circuits 12 and 12' which digitize the outputs of these integrator circuits 11, 11', a gate controller 13 which outputs a gate control signal for controlling the integrator gates of the integrator circuits 11 and 11' and a phase inverter 14 provided to the gate control signal input line of integrator circuit 11'; as in FIG. 3, these are connected to a CPU 5 via a CPU bus.

Figure 7:
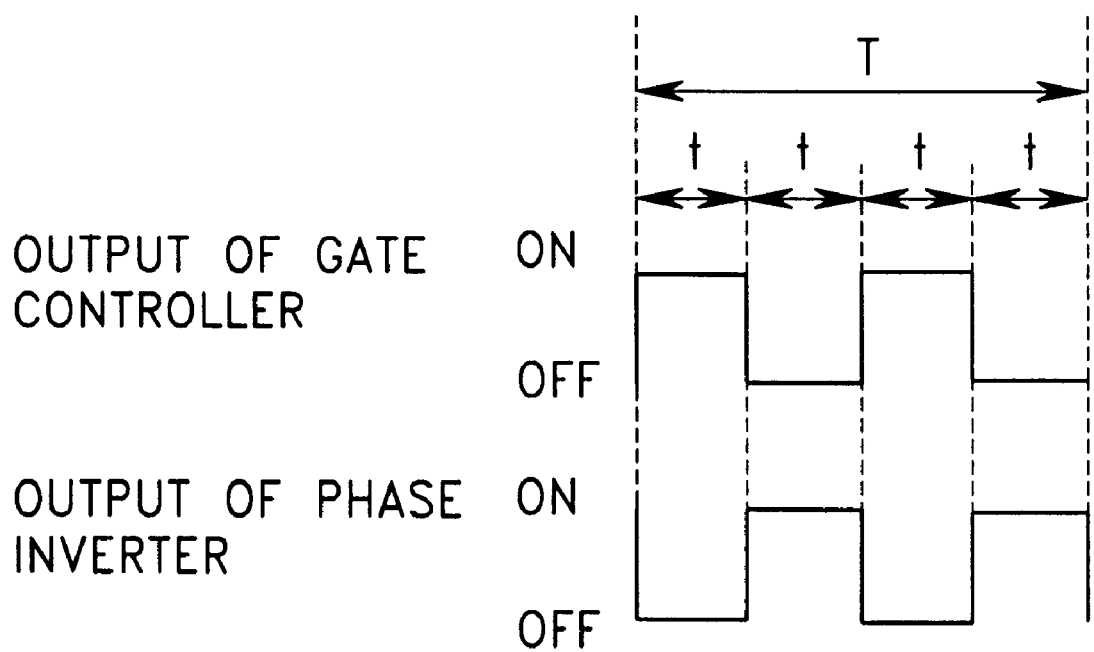
FIG. 7 is a diagram showing gate control signals controlling integrator circuits 11 and 11' respectively.

Gate controller 13 outputs a gate control signal which alternates between ON/OFF at each unit integration time t. A gate control signal from the gate controller 13 is inputted unalterably to integrator circuit 11. Since phase inverter 14 is provided to the gate control signal input line of integrator circuit 11', a gate control signal from the gate controller 13 is inverted prior to being inputted to integrator circuit 11'. In other words, the integrator gate of integrator circuit 11' is controlled with a signal which is an inversion of the signal controlling the integrator gate of integrator circuit 11 as shown in FIG. 7. With this configuration, there is no longer any need to perform measurement over a 2T period as in the first and second embodiments and therefore measurement can now be carried out within a single T period.

Like the first and second embodiments, a waveform measuring system of the present embodiment has the advantages that a integration period T can discretionally set in accordance with the cycle of the analog input voltage and problems such as leakage from the integrator circuit or overflow from the digitizing circuit 2 do not arise even if the integration period T is set to a long time length.

Although the preferred embodiment of the present invention has been described in detail, it should be understood that various changes, substitutions and alternations can be made therein without departing from spirit and scope of the inventions as defined by the appended claims.

What is claimed is:

1. A waveform measuring apparatus comprising:
    an integrator circuit configured to receive an input analog voltage signal and provide an output signal, the integrator circuit having a gate configured to receive a control signal, wherein the integrator circuit integrates the input analog voltage signal when the control signal is ON;
    an A/D converter configured to receive the output signal of the integrator circuit and to digitize the output signal of the integrator circuit;
    a control circuit configured for generating the control signal for the gate, such that the ON/OFF of the gate is based on a unit integration time set discretionally; and
    wherein said control circuit takes the first cycle of a period covering 2 cycles of the analog input voltage to be a first integration period, takes the second cycle thereof to be a second integration period and controls the gate with the control signal which alternates repeatedly between ON/OFF during the first integration period and controls the gate with the control signal inverted in phase during the second integration period.

2. A waveform measuring apparatus according to claim 1, wherein the waveform measuring apparatus has been set to fulfill the following condition when the first and second integration periods are deemed as T and the unit integration time, which is the time when the gate is ON, is deemed as t:

$T=2nt$ (n being a natural number).

3. A waveform measuring apparatus according to claim 2, wherein:
    the control circuit comprises a gate controller for outputting the control signal and a phase shifter for delaying the phase of the control signal by the unit integration time in the second integration period.

4. A waveform measuring apparatus according to claim 1, wherein the waveform measuring apparatus has been set to fulfill the following condition when the first and second integration periods are deemed as T and the unit integration time is deemed as t:

$T=(2n-1)t$ (n being a natural number).

5. An waveform measuring apparatus according to claim 4, wherein:
    the control means consist of a gate controller for outputting the control signal.

* * * * *